United States Patent [19]

Iwasaki et al.

[11] Patent Number: 5,020,775
[45] Date of Patent: Jun. 4, 1991

[54] ISOLATION VALVE USED IN A SINGLE CRYSTAL PULLING APPARATUS

[75] Inventors: Atsushi Iwasaki, Takefu; Koji Mizuishi; Michiaki Oda, both of Annaka, all of Japan

[73] Assignee: Shin-Etsu Handotai Co., Ltd., Tokyo, Japan

[21] Appl. No.: 495,964

[22] Filed: Mar. 20, 1990

[30] Foreign Application Priority Data

Mar. 24, 1989 [JP] Japan .................... 1-70692

[51] Int. Cl.⁵ .................... F16K 1/24; F16K 3/10; F16K 31/143

[52] U.S. Cl. .................... 251/215; 251/301; 251/303; 251/333; 251/900

[58] Field of Search .................... 251/56, 215, 298, 300, 251/301, 333, 900, 157, 177, 193, 303

[56] References Cited

U.S. PATENT DOCUMENTS

| | | | |
|---|---|---|---|
| 241,568 | 5/1881 | Spratt | 251/301 |
| 786,033 | 3/1905 | Herrick | 251/215 |
| 1,197,583 | 9/1916 | Sheridan | 251/333 |
| 1,468,502 | 9/1923 | Keller | 251/215 |
| 2,782,800 | 2/1957 | Hillebrand | 251/333 |
| 2,805,836 | 9/1957 | Taylor | 251/301 |
| 3,511,475 | 5/1970 | Pfau | 251/333 |
| 4,132,386 | 1/1979 | Lee | 251/900 |

Primary Examiner—George L. Walton
Attorney, Agent, or Firm—Lowe, Price, LeBlanc and Becker

[57] ABSTRACT

An isolation valve used in a single crystal pulling apparatus, having a frame (11), a vertical passageway for communication between a main chamber and an upper pull chamber of the single crystal pulling apparatus, a shaft (13) capable of turning about its axis and reciprocating vertically, a lever (20) for turning the shaft, a drive means (18) for reciprocating the shaft (13), an arm (14) fixed to the shaft (13), a circular shutter (15) held by the arm (14) for closing and opening the vertical passageway, and a flange (9) defining a hole which communicates the passageway with the main chamber, wherein a cylindrical cavity is made in the bottom of the circular shutter (15); the flange (9) has a circular raised rim (9b) extending upward whose outer diameter is slightly smaller than the diameter of the cylindrical cavity of the shutter; and an endless circular seal means (17) is embedded partially in either the external vertical wall of the raised rim (9b) of the flange or the internal vertical wall of the shutter (15).

4 Claims, 4 Drawing Sheets

ISOLATION VALVE USED IN A SINGLE CRYSTAL PULLING APPARATUS

BACKGROUND OF THE INVENTION

The present invention relates to an isolation valve used in a single crystal pulling apparatus for opening and closing the passage between the main chamber and the upper pull chamber of the single crystal pulling apparatus.

A single crystal pulling apparatus is designed to grow and pull up a single crystal rod from a melt of a polycrystal substance based on the CZ method (Czochralski method). A conventional single crystal pulling apparatus consists mainly of a main chamber, and in this chamber are a quartz crucible for containing the raw material for crystallization, a carbon heater surrounding the crucible to melt down the raw material, a thermal insulator also made of carbon and surrounding the heater, etc. Above the main chamber is provided an upper pull chamber from which the single crystal ingot (or rod) brought up from the main chamber is removed. An isolation valve is provided between the main chamber and the upper pull chamber for opening and closing the passageway between the two chambers. The present invention relates to this isolation valve in particular, of which a preferred mode is depicted in FIG. 1.

In the conventional single crystal pulling apparatus, the growing and pulling operation of the single crystal is conducted in an inert gas atmosphere at a reduced pressure with the view of preventing the precipitation of the silicon oxides which agglomerates on the cold internal walls of the chambers. The oxides are originally formed as a result of the reactions that take place between the melt and the quartz crucible, and thereafter the oxides evaporate from the melt surface into the atmosphere and precipitate on the walls. Some of the oxide agglomerate often causes a disorder in the single crystallization, as it drops into the melt. Also, the operation at a reduced pressure facilitates reduction in consumption of the costly inert gas which is used to prepare the atmosphere. Thus, before the single crystal ingot is pulled up, the main chamber and the upper pull chamber are rendered in full communication with each other by opening the isolation valve, and the chambers are filled with the inert gas at a reduced pressure.

When the growing and pulling operation of the single crystal ingot is completed, the ingot is lifted up into the upper pull chamber and taken away from a hermetically sealable door which is provided in the side wall of the upper pull chamber. But before opening the door, the isolation valve is often closed so that the reduced internal pressure of the main chamber is isolated from the external atmosphere to thereby enable the high temperature of the system in the main chamber to be kept as it is, whereby the next crystallization operation can be started without having to melt the whole of the residual polycrystal substance all over again. Thus, when the door of the upper pull chamber is opened, the internal pressure of the upper pull chamber equilibrates with the atmospheric pressure while the internal pressure of the main chamber is maintained as low as it was when the last pulling operation was conducted.

It is necessary, therefore, to replace the air in the upper pull chamber with the inert gas and reduce the internal pressure to a level as low as that of the main chamber before opening the isolation valve for the next crystallization (pulling) operation. This replacement of the gases is conducted in the following manner: first, the door of the upper pull chamber is closed, and the air in the upper pull chamber is drawn by a vacuum pump until the internal pressure becomes 0.1 millibar (absolute pressure), for example. Then, the inert gas is introduced in the upper pull chamber till the internal pressure thereof becomes 200 millibar, for example. This operation is repeated two to five times so as to entirely replace the air with the inert gas, and at the final time the internal pressure is made equal to the internal pressure of the main chamber, 100 millibar, for example. Then the isolation valve is opened, and the single crystal pulling operation is started.

Now, with reference to FIG. 6 (a) which shows a sealing portion of a conventional isolation valve, the portion corresponding to the portion A of the preferred isolation valve of the present invention shown in FIG. 1, the sealing system of the conventional isolation valve will be explained. An endless seal ring 117 such as an O ring is embedded in a groove which is made in the upper edge of the raised brim of the hole of the passageway that communicates with the main chamber. The element designated by a reference numeral 115 is a shutter corresponding to the element 15 in FIG. 1. Since the shutter 115 is urged downward with an imposed force of 60 kg, for example, by an air cylinder 18 (shown in FIG. 1 and described later) when the isolation valve is closed, the sealing effect is performed by the seal ring 117. In the case of the isolation valve shown in FIG. 6 (b), the endless seal ring 117 is embedded in the lower face of the circular shutter 115 such that the seal ring 117 touches the horizontal upper edge face of the raised brim of the hole that communicates with the main chamber, when the isolation valve is closed. Thus, the sealing of the clearance between the upper pull chamber and the main chamber is effected when the air cylinder 18 urges the shutter 115 downward.

However, when the air in the upper pull chamber is drawn out by the vacuum pump in an attempt to replace the air with the inert gas, the internal pressure of the upper pull chamber is reduced to a pressure much lower than the internal pressure of the main chamber, e.g. 0.1 millibar. Then, the internal pressure of the main chamber pushes the shutter 115 upwardly with a force F proportional to the differential pressure, whereby the shutter 115, overcoming the downward force imposed by the air cylinder 18, lifts itself to a higher position where the increased downward force by the air cylinder 18 counterbalances the upward force F, as shown in FIGS. 6 (a) and (b). Thus lifted, the shutter 115 allows the inert gas to leak from the main chamber to the upper pull chamber, as shown by the arrows in FIG. 6. As a result, an abnormal lowering in the internal pressure of the main chamber takes place, and furthermore the gases in the process of replacement in the upper pull chamber reversely diffuse into the main chamber to thereby contaminate the inert atmosphere therein. Incidentally, in the case of the above example of pressure values, if the diameter d of the seal ring is 250 mm, the uplifting force F would be about 49 kg.

SUMMARY OF THE INVENTION

It is therefore an object of the present invention to provide an isolation valve used in a single crystal pulling apparatus which does not allow gases to leak from the main chamber even when the shutter is lifted slightly as the air in the upper pull chamber is drawn, so that an abnormal drop in the internal pressure of the main chamber and contamination of the inert gas in the main chamber are prevented.

In order to attain the above and other objects of the invention, an improved isolation valve for opening and closing the communication passage between a main chamber and an upper pull chamber of a single crystal pulling apparatus is provided. In this invention isolation valve which has a frame body 11, a vertical passageway for communicating the main chamber and the upper pull chamber, a vertical shaft (13) capable of turning about its axis and reciprocating vertically, a lever (20) for turning the shaft (13) about the shaft's axis, a drive means (18) for driving the shaft (13) to reciprocate vertically, a horizontal arm (14) fixed to the shaft (13) at one end, a circular shutter means (15) horizontally held by the arm (14) for closing and opening the vertical passageway, and a flange (9) defining a hole which communicates the passageway with the main chamber, the improvement comprises in that a cavity (hollow) of which at least the lower portion is formed in the shape of a circular cylinder is made in the bottom of the circular shutter (15), that the flange (9) has a circular raised rim (9b) whose outer diameter is slightly smaller than the diameter of the circular cylindrical portion of the cavity of the shutter, and that an endless circular seal means (17) is embedded partially in a vertical engaging face which slides when said circular cylindrical portion of the cavity of the shutter engages with said circular raised rim.

In a preferred embodiment, the cavity made in the bottom of the circular shutter (15) is entirely formed in the shape of a circular cylinder.

In a preferred embodiment, the endless circular seal means is partially embedded in either the external vertical wall of the raised rim (9b) of the flange or the internal vertical wall of the shutter (15).

Since the circular raised rim (9b) has an outer diameter slightly smaller than the inner diameter of the cylindrical hollow of the circular shutter, the shutter slidably covers up the circular raised rim of the flange (9) and since an endless circular seal means is embedded in either one of the sliding faces, the sealing effect is maintained even while the sliding movement occurs between the two sliding faces, such as when the shutter is lifted a little by the internal pressure of the main chamber.

Therefore, with a single crystal pulling apparatus equipped with the isolation valve of the invention, there will occur no leakage of an inert gas from the main chamber to the upper pull chamber while the isolation valve is closed even when the internal pressure of the upper pull chamber becomes extremely lower than that of the main chamber. Thus, abnormal lowering in the internal pressure of the main chamber as well as the contamination of the inert gas in the main chamber due to the reverse diffusion of the air from the upper pull chamber is effectively prevented.

Further scope of applicability of the present invention will become apparent from the detailed description given hereafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF PREFERRED EMBODIMENTS

Figure 1:
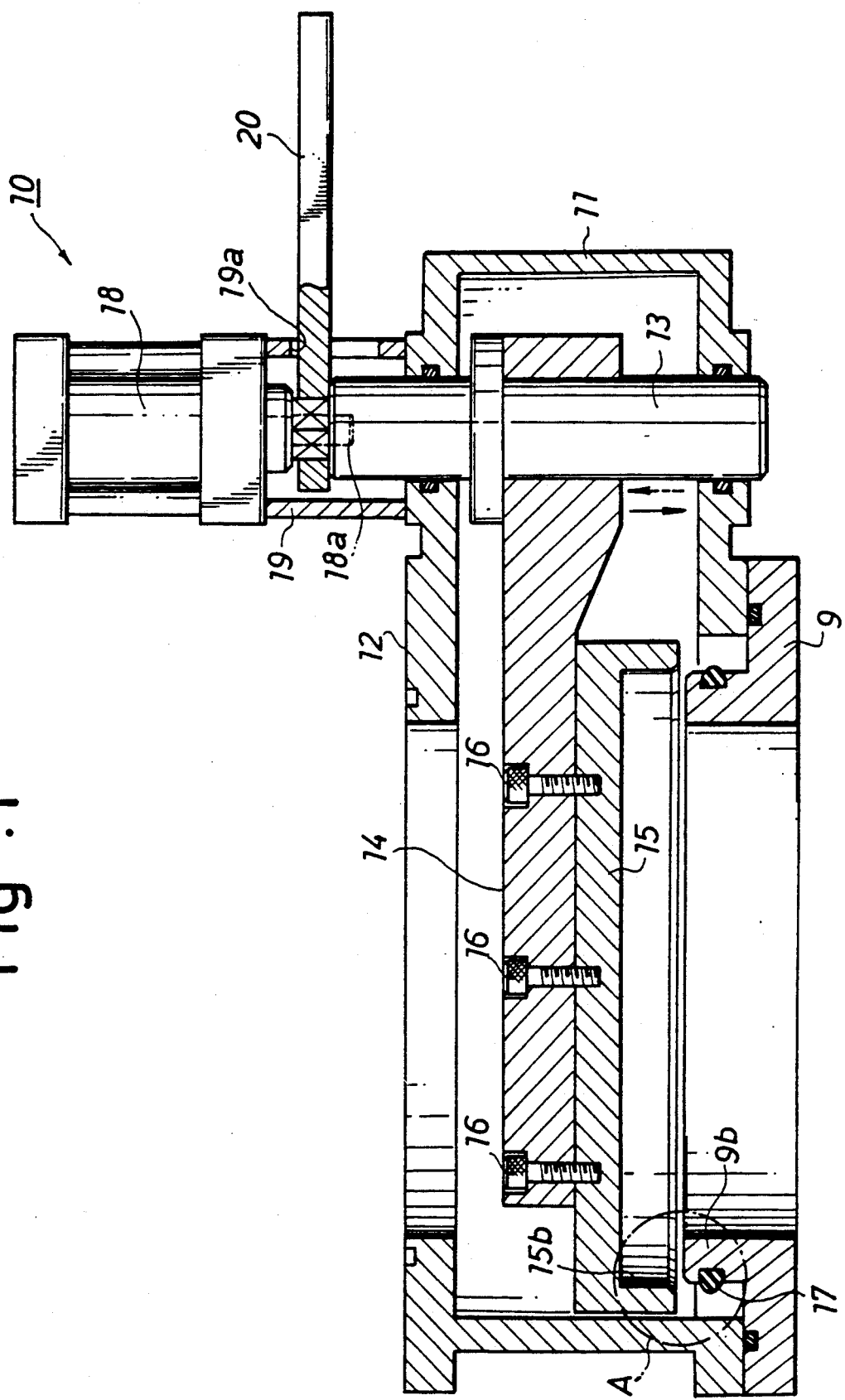
FIG. 1 is a vertical cross section of an isolation valve of the invention.
Figure 2:
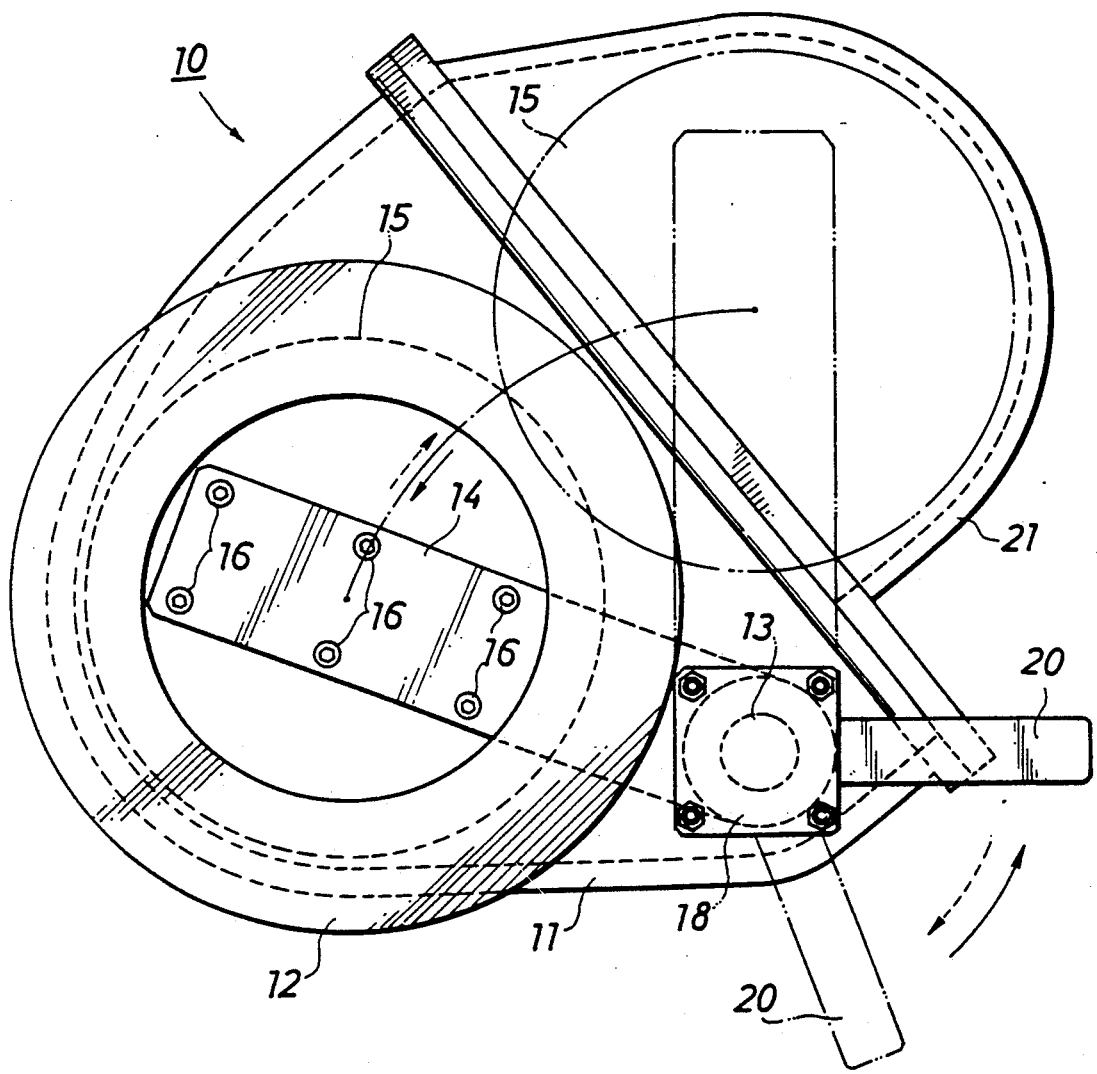
FIG. 2 is a plan view of the same isolation valve shown in FIG. 1.
Figure 3:
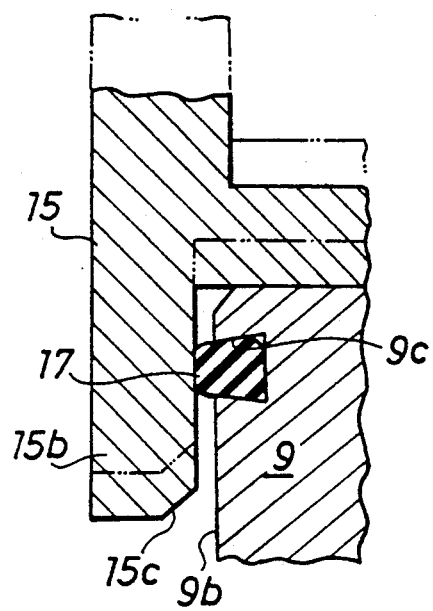
FIG. 3 is an enlarged view of that portion of the same isolation valve shown in FIG. 1 that is generally enclosed by the one-dot chain line circle of reference letter A.
Figure 4:
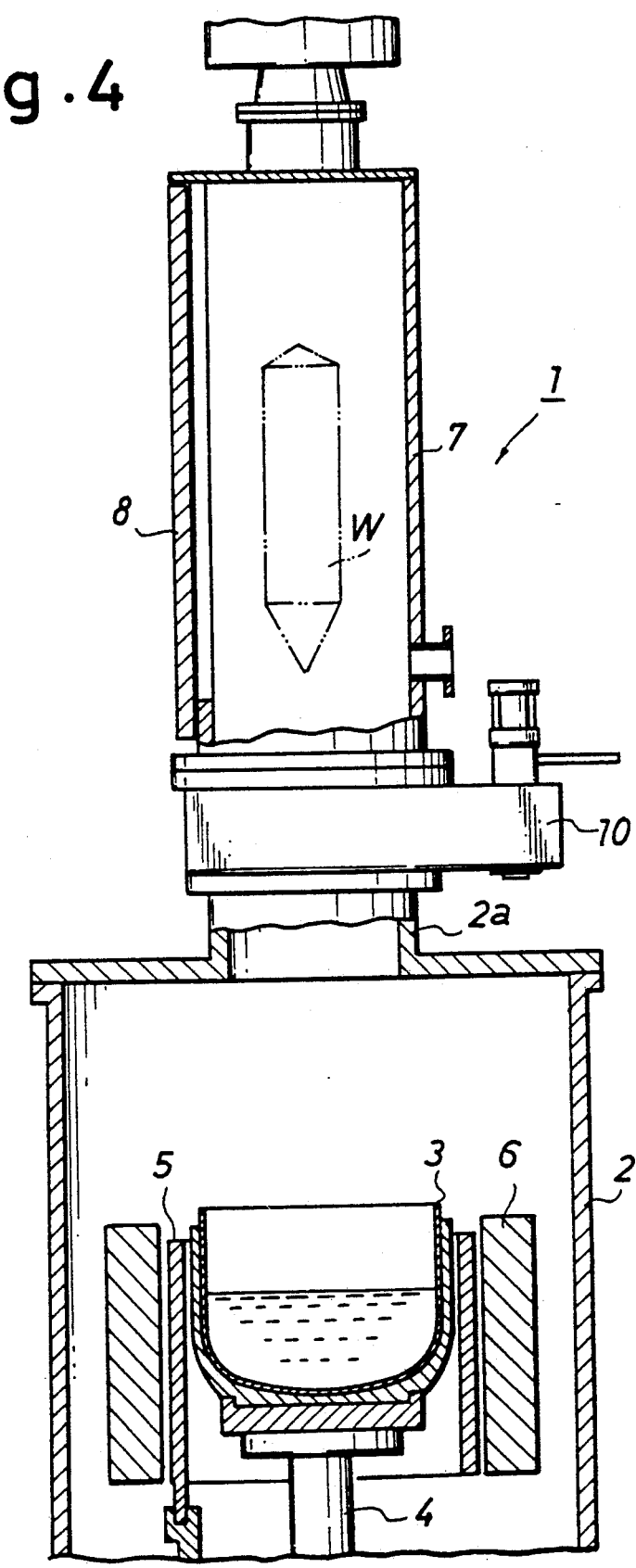
FIG. 4 is a vertical view of a single crystal pulling apparatus, mostly shown in cross section.

An embodiment of the invention will be described with reference to FIGS. 1 through 4. In FIG. 1 a vertical cross section of an isolation valve 10 according to the invention is shown. FIG. 2 shows a plan view of the same isolation valve 10. FIG. 3 is an enlarged view of that portion of the same isolation valve 10 that is generally enclosed by the one-dot chain line circle of reference letter A, in which it is seen that the valve is closed. FIG. 4 is a vertical view of a single crystal pulling apparatus 1, mostly shown in cross section.

First, in FIG. 4 the single crystal pulling apparatus 1 is schematically shown. The reference numeral 2 designates a main chamber (commonly called simply as a chamber) which comprises a right cylindrical tank (tube) made of stainless steel. The bottom portion of the chamber 2 is not shown. Inside of the chamber 2 are a crucible 3, a crucible supporter 4, a heater 5, a thermal insulator 6, etc. The crucible 3 is made of quartz, and is mounted on the support shaft 4 which is adapted to turn about its axis. The heater 5 is made of carbon, and, like the thermal insulator 6, has the shape of a cylindrical tube arranged coaxially with the support shaft 4 such that the heater 5 surrounds the crucible 3. The thermal insulator 6 also made of carbon surrounds the heater 5.

A projected ceiling 2a having a central flanged hole is provided on the top of the main chamber 2. An isolation valve 10 is provided on the top of the central flange of the ceiling 2a, and adapted to open and close the flanged hole. A cylindrical upper pull chamber 7 made of stainless steel has a flanged bottom, and is provided vertically on the top of the isolation valve 10 via the flanged bottom such that the upper pull chamber 7 is coaxial with the flanged hole of the ceiling 2a. A hermetically sealable open/close door 8 is provided on the side of the upper pull chamber 7 so that an ingot W raised from the crucible 3 can be taken out from the upper pull chamber 7. The isolation valve 10 provided between the upper pull chamber 7 and the main chamber 2 is capable of communicating and discommunicating the two chambers.

Now, referring to FIGS. 1 and 2 the isolation valve 10 is described in detail.

In FIG. 1, the reference numeral 9 designates a flange which is adapted to fit hermetically on the flange of the ceiling 2a of the main chamber 2 (ref. FIG. 4), and the flange 9 is fixed to a box-like main body 11 of the isolation valve 10. A flat flange 12 which integrally forms the ceiling of the box-like main body 11 is provided such that the hole thereof is coaxial with that of the flange 9. The flat flange 12 is hermetically fitted onto the bottom flange of the upper pull chamber 7 (ref. FIG. 4).

A vertical shaft 13 is provided in the isolation valve such that the shaft 13 penetrating the box-like main body 11 can slide vertically and spin about its axis. An arm 14 is fixed to the middle portion of the shaft 13 such that the arm can swing horizontally as the shaft 13 spins. The arm 14 is entirely contained in the box-like main body 11. A shutter 15 which is in the shape of a Petri dish or a cap for a camera lens is fixed to the lower face of the free end of the arm 14 by six bolts 16 in such a manner that the hollow side of the shutter 15 faces downward. Thus, the shutter 15 is disposed to swing horizontally as the shaft 13 spins, and is disposed to move up and down as the shaft 13 slides up and down.

In FIG. 1 the shaft 13 is in its upper position, and the shutter 15 is assuming the uncapped position. When the shaft 13 is displaced downward from the upper position, the arm 14 together with the shutter 15 is displaced downward. Now, the hollow side of the shutter 15 is so designed that when the shutter 15 is displaced downward, the upper part of the flange 9, which is raised to form a step 9b from the flange plate, fits in the hollow of the shutter 15, whereby the shutter 15 assumes the sealing position. When the flange 9 is thus capped with the shutter 15, the communication between the main chamber 2 and the upper pull chamber 7 is interrupted. To facilitate this discommunication, an O ring 17 made of fluorine-contained rubber is embedded partially in a groove 9c which runs round in the side wall of the step 9b. When the shutter 15 is in the closing position, the inner wall of the rim 15b of the shutter 15 depresses the O ring 17, as shown in FIG. 3. Incidentally, the inner corner edge 15c of the rim 15b of the shutter 15 is chamfered so as not to damage the O ring 17.

An air cylinder 18, supported by a cylindrical mount 19 standing on the main body 11, is provided above and coaxially with the shaft 13. A rod 18a extending vertically from the bottom of the air cylinder 18 is connected to the head of the shaft 13. Thus the shaft 13 is vertically displaced by means of the air cylinder 18. A lever 20 is fixed at its one end to the rod 18a so that the shaft 13 is revolved when the lever 20 is manually operated to turn horizontally. Incidentally, the cylindrical mount 19 has a window through which the lever 20 extends externally, and by virtue of which the lever 20 has a freedom of swinging horizontally and moving vertically.

Referring to FIG. 2 the shutter 15 drawn in broken line is assuming either the sealing position or the unsealed position, while the shutter 15 drawn in two-dot chain line is assuming the tucked-away position whereat the main chamber 2 and the upper pull chamber 7 are in communication. The reference numeral 21 designates a cover in which most part of the shutter 15 is housed when the shutter 15 assumes the tucked-away position.

Next, the operation of the isolation valve 10 will be explained.

Let us suppose that the shutter 15 is currently assuming the unsealed position as shown in FIG. 1. When the lever 20 is turned in the clockwise direction as seen in FIG. 2 (the direction shown in the broken-line arrows), the rod 18a is turned in the same direction together with the shaft 13, the arm 14, and the shutter 15, whereby the arm 14 and the shutter 15 are tucked away in the cover 21 to assume the tucked-away position as drawn in the two-dot chain line. Now, the main chamber 2 and the upper pull chamber 7 are in full communication via the isolation valve 10, and the two chambers are filled with argon gas and the reduced internal pressure therein is 100 millibar.

With the elements disposed as described above, the heater 5 is electrified to heat and melt the polycrystal substance (such as polycrystalline silicon) contained in the crucible 3. When the polycrystal substance is entirely melt down, a seed crystal, not shown, is lowered from the upper pull chamber until the tip of the seed crystal dips in the melt. Then, the seed crystal is turned and raised slowly, whereby a single crystal ingot W (drawn in two-dot chain line in FIG. 4) is pulled up into the upper pull chamber 7. Now, the isolation valve 10 is closed in the following manner.

Referring to FIGS. 1 and 2 again, the lever 20 is turned in the anti-clockwise direction as seen in FIG. 2 (the direction shown in the solid-line arrows) whereby the rod 18a is turned in the same direction together with the shaft 13, the arm 14, and the shutter 15. Thus, the arm 14 and the shutter 15 leave the cover 21 and assume the uncapped position as drawn in the solid or broken line in FIG. 2, or in the hatched cross section in FIG. 1. On this occasion, the shutter 15 poses directly above and coaxial with the flange 9.

Now, the air cylinder 18 is operated such that the rod 18a is displaced downward to thereby push the shaft 13 to shift downward (as shown in the solid arrow in FIG. 1). This operation simultaneously brings down the lever 20, the arm 14, and the shutter 15 all together by the same amount. And this amount is designed to be sufficient to bring the shutter 15 into the sealing position which is partially shown in FIG. 3. In this sealing position the central hole in the flange 9 is shut by the shutter 15. And this shutting of the flange hole is hermetically accomplished as the inner wall of the rim 15b of the shutter 15 depresses the O ring 17, as shown in FIG. 3. Owing to this so-called side seal effect, the argon gas does not leak from the isolation valve 10 at all.

With the isolation valve 10 thus closed, the door 8 shown in FIG. 4 is opened and the as-grown single crystal ingot W is removed from the upper pull chamber 7. As the door 8 is opened, the air rushes into the upper pull chamber 7 whereby the pressure therein equilibrates with an atmospheric pressure. But, by virtue of the hermetically closed isolation valve 10, the internal pressure of the main chamber 2 is maintained at 100 millibar, as it was when the single crystal rod W was being raised.

Before opening the isolation valve 10 to resume the single crystal pulling operation, the atmospheric air in the upper pull chamber 7 is replaced by the same inert gas under a reduced pressure in the following manner. First, the door 8 of the upper pull chamber 7 is closed, and the air in the upper pull chamber 7 is drawn by a vacuum pump, not shown, until the internal pressure becomes 0.1 millibar (absolute pressure). Then, the inert gas is introduced in the upper pull chamber 7 till the internal pressure thereof becomes 200 millibar. This operation is repeated two to five times so as to entirely replace the air with the inert gas, and at the final time the internal pressure is made equal to the internal pressure of the main chamber, that is, 100 millibar. Then the isolation valve is opened.

When the internal pressure of the upper pull chamber 7 is reduced to 0.1 millibar, the internal pressure (100 millibar) of the main chamber 2 pushes the shutter 15 upward and the shutter 15 is displaced upward a little to assume a position drawn in the two-dot chain line in FIG. 3. But by virtue of the O ring 9c, which is in contact with the vertical inner wall of the rim 15b of the shutter 15, the upward displacement of the shutter 15 merely causes the vertical inner wall of the rim 15b to slide on the O ring 9c without losing the contact therewith and thus the hermetic sealing is maintained. Therefore, the argon gas in the main chamber 2 does not leak out, and the gas replacement operation can be conducted with high efficiency.

When the gas replacement operation is completed, the isolation valve 10 is opened in the following manner. First, the air cylinder 18 is operated to withdraw the rod 18a upward whereby the shutter 15 together with the shaft 13, the lever 20, and the arm 14, is raised to assume the uncapped position, wherein the shutter 15 poses directly above and coaxial with the flange 9. Then, the lever 20 is turned in the clockwise direction, as seen in FIG. 2 whereby the shutter 15 moves into the cover 21 to assume the tucked-away position. Thus, the main chamber 2 and the upper pull chamber 7 are brought in full communication with each other.

Figure 5:
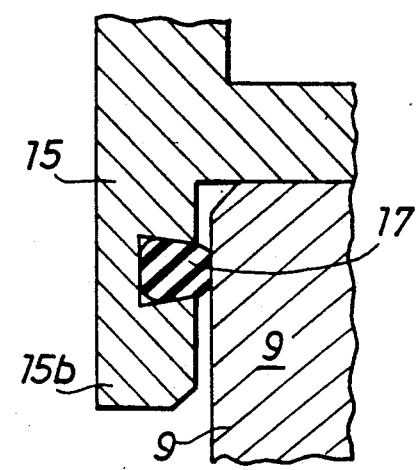
FIG. 5 is a cross-sectional view of the sealing portion of another embodiment of the isolation valve, similar as FIG. 3.
Figure 6:
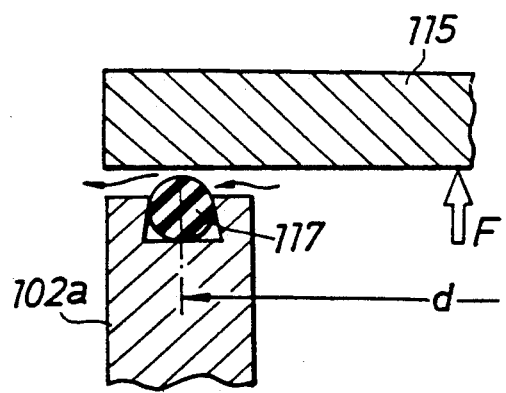
FIGS. 6 (a) and (b) are cross-sectional views of the sealing portion of conventional isolation valves.
Figure 6:
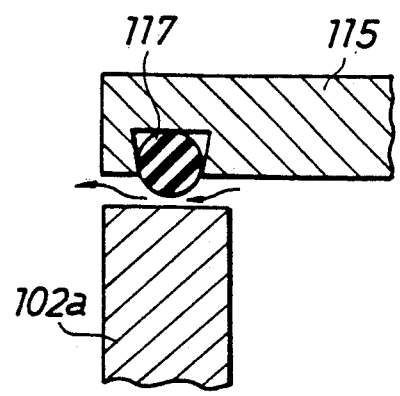

Incidentally, although in this embodiment the O ring 17 is embedded in the groove 9c made in the flange 9, it is also possible alternatively to attain the side seal effect of the invention by making a groove in the inner wall of the rim 15b of the shutter 15 and embedding the O ring 17 in the groove, as shown in FIG. 5. In either case, to facilitate the safe fixture of the O ring in the groove, the groove is shaped such that the cross section of the groove is narrowing toward the surface of the element in which the groove is made.

As is clear from the above explanation of a preferable embodiment of the invention, since the side seal system is adopted in the isolation valve of the single crystal pulling apparatus, the sealing performance of the isolation valve is not interrupted even when the internal pressure of the main chamber 2 becomes greater than the internal pressure of the upper pull chamber 7 and the shutter 15 is slightly lifted up against the pressure of the air cylinder 18 urging the shutter 15 downward. Hence the gas in the main chamber 2 is prevented from leaking through the isolation valve, and thus abnormal reduction in the internal pressure of the main chamber 2 does not occur. Also the contamination of the internal atmosphere of the main chamber 2 does not occur.

The invention being thus described, it will be obvious that the same may be realized in many modified ways. Such modifications are not to be regarded as a departure from the spirit and scope of the invention, and all such modifications as would be obvious to one skilled in the art are intended to be included within the scope of the following claims.

What is claimed is:

1. In an isolation valve for use in a single crystal pulling apparatus for opening and closing a communication passage between a main chamber and an upper pull chamber of the single crystal pulling apparatus, said valve having a frame body, a vertical passageway for communicating the main chamber and the upper pull chamber, a vertical shaft capable of turning about its axis and reciprocating vertically, a lever for turning the shaft about the shaft's axis and reciprocating vertically a drive means for driving the shaft and the lever to reciprocate vertically for a predetermined distance, a horizontal arm fixed to the shaft at one end, a shutter means horizontally held by the arm for closing and opening the vertical passageway, and a flange defining a hole which communicates the passageway with the main chamber, the improvement comprising:
said shaft being supported to vertically penetrate said main body of said isolation valve in a manner such that said shaft and said lever can turn about its own axis and reciprocate vertically so that said horizontal arm fixed to a middle portion of said shaft is caused to swing horizontally and reciprocate vertically;
a cavity of which at least the lower portion is formed in the shape of a circular cylinder is made in the bottom of said shutter means which is circular;
said flange has a circular raised rim extending vertically upward whose outer diameter is slightly smaller than the diameter of said circular cylindrical portion of the cavity of said shutter means; and
an endless circular seal means which is embedded partially in a vertical engaging face which slides when said circular cylindrical portion of said cavity of said shutter means engages with said circular raised rim.

2. An isolation valve as claimed in claim 1 wherein said cavity made in said bottom of said shutter means is entirely formed in the shape of a circular cylinder.

3. An isolation valve as claimed in claim 2 wherein said endless circular seal means is embedded partially in an outer vertical wall of said circular raised rim of the flange.

4. An isolation valve as claimed in claim 2 wherein said endless circular seal means is embedded partially in an inner vertical wall of said shutter means defining said cavity.

* * * * *